United States Patent [19]

Snell

[11] 3,964,571

[45] June 22, 1976

[54] ACOUSTIC SYSTEM

[76] Inventor: Peter Garland Snell, 25 Barton St., Newburyport, Mass. 01950

[22] Filed: Apr. 1, 1975

[21] Appl. No.: 564,153

[52] U.S. Cl. ................................ 181/150; 181/144; 181/152; 181/155; 181/187; 181/199

[51] Int. Cl.[2] ..................... H05K 5/00; G10K 11/00

[58] Field of Search ........... 181/144, 147, 148, 150, 181/152, 154–156, 187, 191, 153, 199

[56] References Cited

UNITED STATES PATENTS

| | | | |
|---|---|---|---|
| 1,509,567 | 9/1924 | Sandell | 181/187 |
| 1,943,499 | 1/1934 | Williams | 181/159 |
| 2,038,253 | 4/1936 | Wheeler et al. | 181/155 |
| 2,203,875 | 6/1940 | Olson | 181/187 |
| 2,210,477 | 8/1940 | Benecke et al. | 181/150 |
| 2,955,669 | 10/1960 | Rice | 181/199 |
| 2,975,852 | 3/1961 | Chave | 181/155 |
| 3,356,179 | 12/1967 | Tompkins | 181/152 |

OTHER PUBLICATIONS

"A Symmetrical Corner Speaker" by W. E. Gilson and J. J. Andrea, Audio Engineering – Mar. 1950, pp. 16–17.

"Exponential Baffles for Custom Installations" by George Augspurger, Audio Engineering – Nov. 1951, pp. 24–27, 67.

"Design for Smooth Response" by Vern Yeich, Audio Engineering – Jan. 1952, pp. 15, 36.

*Primary Examiner*—Stephen J. Tomsky

*Attorney, Agent, or Firm*—Joseph S. Iandiorio

[57] ABSTRACT

An acoustic system for disposition proximate to an acoustical boundary comprising at least one acoustic transducer for directing acoustic energy away from the boundary and an acoustic reflector surface extending, without substantial acoustic discontinuity, from proximate to the center of the transducer to the boundary.

12 Claims, 19 Drawing Figures

ACOUSTIC SYSTEM

FIELD OF INVENTION

This invention relates to an improved acoustic system for disposition proximate to an acoustical boundary and more particularly to such a system including an acoustic reflector surface extending from close to the center of an acoustic transducer to the boundary.

BACKGROUND OF INVENTION

The performance of an acoustic transducer such as an audio loudspeaker is greatly influenced by nearby acoustic boundaries, such as ceilings, floors, and walls. The acoustic waves reflecting from these boundaries are sometimes in phase, sometimes out of phase with the acoustic waves coming directly from the speaker. This results in variations in the acoustic power output of the speaker as a function of frequency and also results in irregularities in the sound pressure as a function of frequency.

For frequencies whose wavelengths are long compared with the distance from the speaker diaphragm to an acoustic reflecting boundary, the reflected sound is substantially in phase with the direct sound from the diaphragm of the speaker or other acoustic transducer. If the mechanical impedance of the speaker is much greater than the radiation resistance load on the diaphragm, then the reflected sound will produce increased sound pressure levels and therefore greater power output from the acoustic transducer or speaker. Thus the low frequency power output is increased by approximately 3db by one area of a nearly acoustical boundary, 6db by two nearly mutually perpendicular areas of an acoustical boundary and 9db by three nearby mutually perpendicular areas of an acoustical boundary. In contrast the power output is affected very little by acoustical boundaries at high frequencies where the wavelengths are less than twice the distance from the diaphragm of the acoustic transducer to the acoustic boundary. At intermediate frequencies where the wavelengths are approximately two to five times the distance from the diaphragm of the acoustic transducer to the reflective acoustic boundary there is less acoustic output than if there were no reflecting boundary because of destructive interference between direct and reflected waves. The severity of this reduction of the power output of the acoustic transducer increases with the number of areas of which the acoustic reflective boundary is made: an acoustical boundary having three areas each equidistant from the diaphragm of the acoustic transducer or speaker produces a much larger dip in the response than a boundary having but one such area.

There are important similarities between the effect of nearby boundaries on power response and the effect of nearby boundaries on pressure response and on excitation of room standing wave modes. For low frequencies, the sound pressure increases due to the proximity of a boundary, the increase becoming greater as the number of areas of the boundary increases. However, in the frequency range where the wavelengths are approximately two to five times the distance from the diaphragm to the boundary, the sound pressure is less than if there were no boundaries. Similarly if a transducer is much closer to one boundary of a pair of parallel boundaries, then all low frequency standing wave modes are excited, whereas in approximately the same intermediate frequency range described above, the standing wave modes are excited very little.

Another problem associated with conventional acoustic transducers such as audio loudspeakers and the like arises from diffraction effects. For example, the edges of a conventional loudspeaker cabinet produces diffracted waves which interfere with the direct sound waves from the diaphragm of the speaker causing additional irregularities in the pressure response as a function of frequency. The severity of the effect depends upon the cabinet shape and the location of the diaphragm on the cabinet.

SUMMARY OF INVENTION

It is an object of this invention to provide, for use near an acoustic boundary, an improved acoustic system including one or more acoustic transducers having more uniform response throughout all frequency ranges, the low, high and intermediate.

It is a further object of this invention to provide such an improved acoustic system which has more uniform axial and polar pressure response and power response throughout all frequency ranges, the low, high and intermediate.

It is a further object of this invention to provide such an improved acoustic system which extends to a significantly higher frequency the range over which reflected waves are in phase with and therefore effectively reinforce the direct sound from the transducer.

It is a further object of this invention to provide such an improved acoustic system which minimizes those reflections from a nearby acoustic boundary which are out of phase with the direct sound from the transducer.

It is a further object of this invention to provide such an improved acoustic system which reduces the amplitude of the diffracted waves and thereby the interference of the diffracted waves with the direct sound from the transducer.

It is a further object of this invention to provide such an improved acoustic system which makes it possible and practical to accomplish these improvements with a transducer covering any frequency range, not just the low frequency range.

The invention results from the realization that flat power and pressure response for a given acoustic transducer can be extended to a substantially higher frequency than would otherwise be possible by providing an acoustical reflector surface which extends from close to the center of the acoustic transducer's diaphragm outwardly to the acoustical boundary which is proximate to the acoustic system in which the acoustic transducer is included, and that the diffraction effects can be greatly reduced by using such an acoustic reflector surface which eliminates any substantial acoustic discontinuities.

The invention features an acoustic system, comprising at least one acoustic transformer, designed for disposition proximate to an acoustical boundary. The acoustic transducer is also positioned proximate to the boundary and in such a way that it directs acoustic energy away from the boundary. The acoustic system includes an acoustic reflector surface whose acoustic distance from the center of the transducer's diaphragm is significantly less than the acoustic distance from the center of the diaphragm to the boundary. This surface extends from near the diaphragm to the boundary without substantial acoustic discontinuity along its extent or at the junction of the boundary and surface.

The closeness of the surface to the center of the diaphragm makes possible an extension of the speaker's frequency range of flat power response and flat axial and polar pressure response. The range is extended to a higher frequency approximately in inverse proportion to the ratio of the acoustic distance from the reflector surface to the center of the diaphragm to the acoustic distance from the boundary to the center of the diaphragm. The section or sections of the surface may be placed at any position between the boundary and the center of the diaphragm. However, the improvement is less if the sections are placed much closer to the boundary than to the center of the diaphragm. Conversely, problems may arise if the sections are placed excessively close to the center of the diaphragm. For example, if the sections are acoustically sealed to the transducer, a severe Helmholtz resonance may occur if the opening between the sections becomes too small. Thus, one improvement which results from the proximity of the reflector surface to the diaphragm is an extension in the transducer's useful range of response of anywhere between a fraction of an octave and more than two octaves.

In many situations, optimum performance is attained if the acoustic distance between the reflector surface and the center of the transducer's diaphragm is substantially less than one fourth of the wavelength of the highest frequency reproduced by the particular transducer. Thus the sound reflected from the surface will be in phase with the direct sound from the transducer, allowing for flat power response and flat axial and polar pressure response throughout the frequency range of the transducer. In some situations, it may be undesirable to place the surface closer to the center of the diaphragm than one fourth of the wavelength of the highest frequency of the particular transducer, but even so a wider range of flat response is possible with the surface than without it.

The acoustic reflector surface of the acoustic system is designed to eliminate any substantial acoustic discontinuities along its extent or at its junction with the boundary. By substantial acoustic discontinuity is meant a discontinuity which represents a significant change in conditions in the propagation medium of a sound field such as caused by an irregularity in the surface of termination of a reflecting surface as discussed in "Acoustic Techniques and Transducers", M. L. Gafford, MacDonald & Evans, Ltd., London, 1961, Page 14 et seq. It is particularly important that there be no substantial acoustic discontinuities for all frequencies within the bandwidth of the transducer. To achieve this the surface is shaped as a gradual transitionary surface between its inner edge near the transducer's diaphragm and the boundary, blending gradually into the boundary or wall, and is provided with a smooth surface although the latter is not absolutely necessary as long as there is no substantial discontinuity. The closer the transducer is to the boundary, the shorter need be the surface in order to achieve the desired gradual transition and therefore the acoustic system can be smaller. There sometimes is a small discontinuity where the outer edge of the reflector surface meets the boundary, depending on the construction techniques of the acoustic system.

If the acoustic system is designed according to the invention, then the sound from the transducer, as it travels in front of the reflector surface and then outwardly into the acoustic space beyond the acoustic system, encounters no substantial acoustic discontinuities in its path, and thus no substantial diffracted waves are produced, and there is no substantial interference between diffracted waves and the direct waves from the transducer.

The diaphragm of the transducer refers to the source of the sound, whether it be a cone, dome, membrane, or even a non-solid substance. The acoustic distance refers to the shortest acoustic-path-distance. Thus when the reflector surface extends in front of the transducer, the acoustic distance from the surface to the center of the diaphragm is a straight line from the diaphragm's center to the closest part of the surface. However, when the surface extends behind the speaker the shortest acoustic-path-distance is not a straight line but extends from the diaphragm's center, over, around and behind the transducer to the reflector surface.

DISCLOSURE OF PREFERRED EMBODIMENT

Other objects, features and advantages will occur from the following description of a preferred embodiment and the accompanying drawings, in which.

Figure 1:
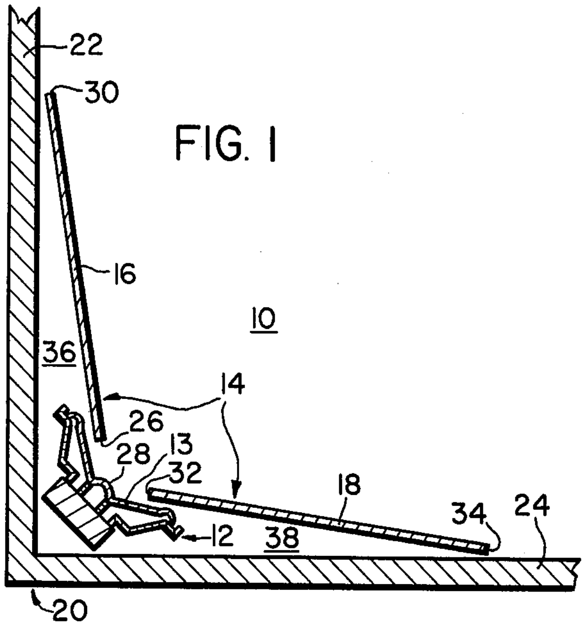
FIG. 1 is a simplified schematic plan view of an acoustic system including an acoustic transducer and reflector surface according to this invention disposed proximate to an acoustic boundary.
Figure 4:
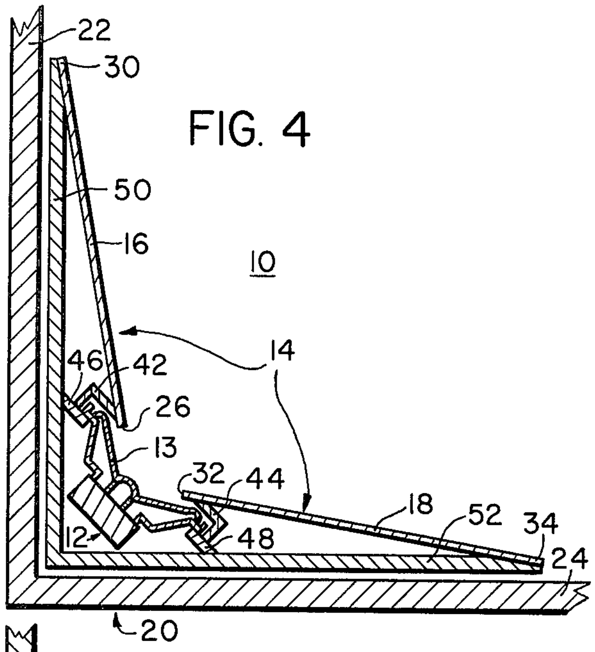
Figure 5:
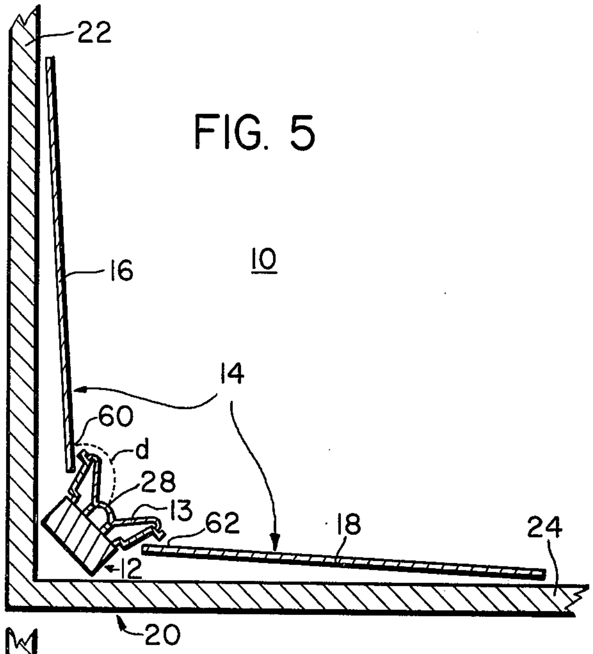
Figure 6:
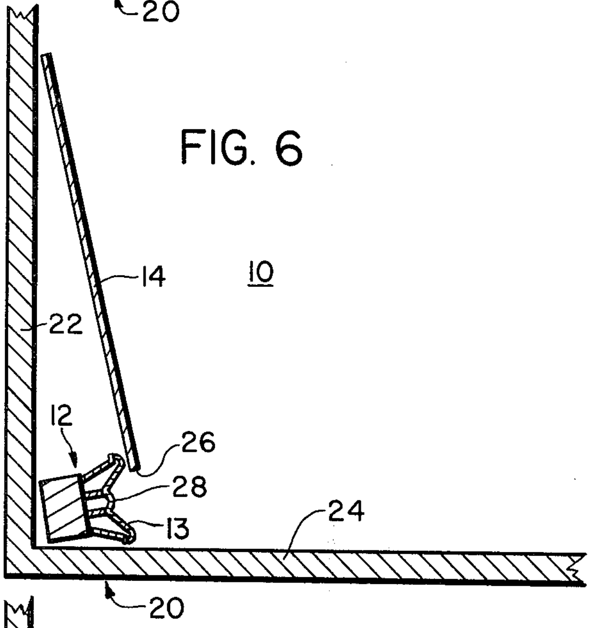
Figure 7:
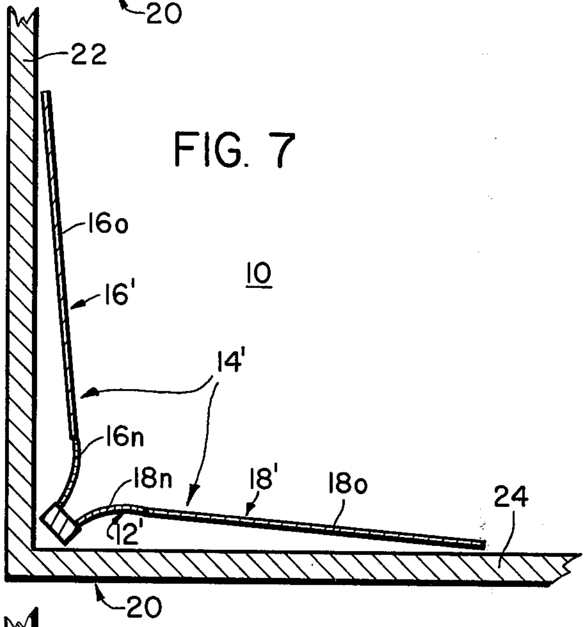
Figure 8:
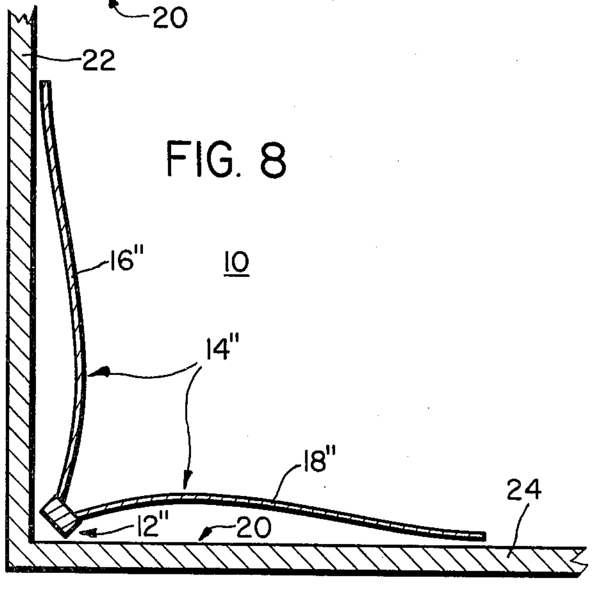
Figure 9:
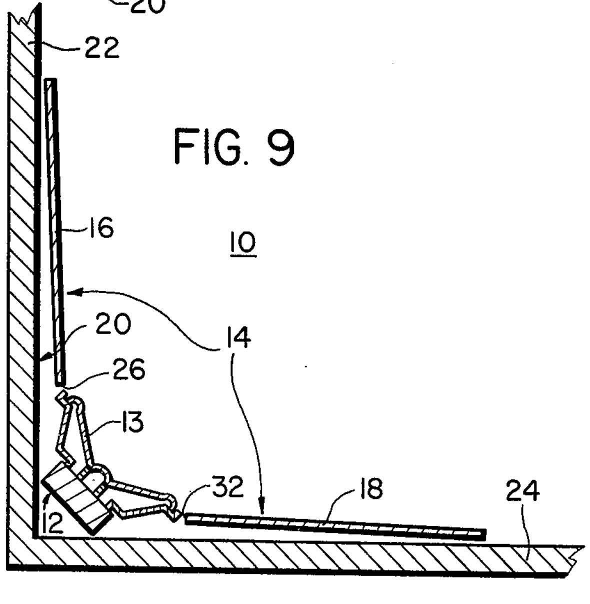
Figure 10:
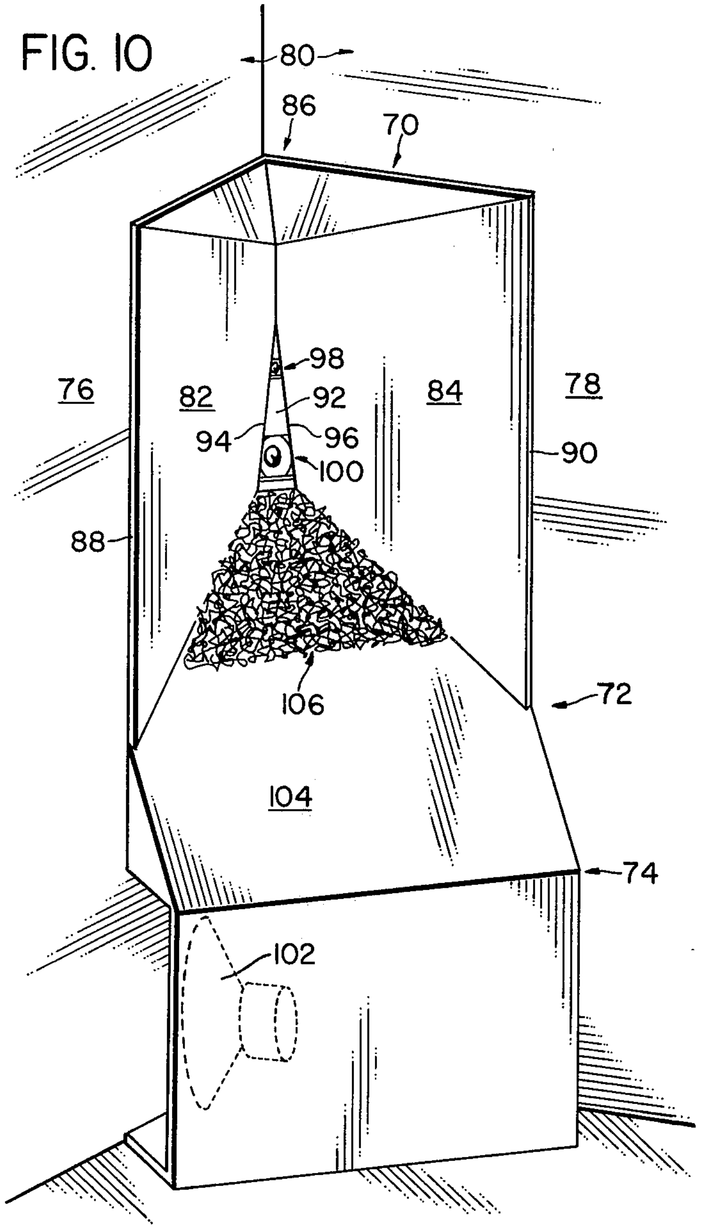

FIGS. 3A–J are simplified, schematic diagrams of various arrangements of reflector surfaces and acoustic transducers according to this invention utilizing reflector surfaces having one, two or three sections in conjunction with one or more acoustic transducers;

FIG. 4 is a view similar to that of FIG. 1 showing a reflector surface sealed to an acoustic transducer;

FIG. 5 is a view of the acoustic system according to this invention as shown in FIG. 1 with the reflector surface extending behind the acoustic transducer;

FIG. 6 is a view of the acoustic system according to this invention as shown in FIG. 1 with the transducer placed asymmetrically and with a single reflector surface placed adjacent the side of the transducer diaphragm which is farthest from the boundary;

FIG. 7 is a view of an alternative embodiment of the acoustic system according to this invention as shown in FIG. 1 in which a portion of the reflector surface close to the acoustic transducer is integral with the acoustic transducer;

FIG. 8 is a view similar to FIG. 7 in which the entire reflector surface is integral with the acoustic transducer;

FIG. 9 is a view of the acoustic system according to this invention as shown in FIG. 1 where the portion of the reflector surface closest to the diaphragm lies alongside the transducer; and FIG. 10 is an axonometric, diagrammatic view of an acoustic system according to this invention embodied in a multi-transducer speaker system using a single structure for installation in the corner of a room.

The invention may be accomplished in an acoustic system for disposition proximate to an acoustical boundary. The acoustic system includes at least one acoustic transducer for directing acoustic energy away from the boundary and an acoustic reflector surface extending from proximate to the center of the transducer to the boundary without substantial acoustic discontinuity along its extent or at the junction of the boundary and surface. The boundary may consist of one or two or more areas. For example, if the acoustic transducer is placed in the corner of a room the relevant acoustic boundary would include two areas, namely, the two walls which meet to form the corner in which the acoustic transducer is located. If the transducer is placed in the corner at the top adjacent the ceiling or at the bottom adjacent the floor then the boundary is considered to have three areas, the two walls being two of the areas and the third area being constituted by either the floor or the ceiling depending upon where the acoustic transducer is placed. The acoustic boundary is not necessarily the boundary of a conventional room, and could be the ground and/or a wall outdoors, or the boundary of any arbitrary acoustic space.

The acoustic reflector surface of the acoustic system may be constituted by one continuous section or by a number of sections. The number of sections of the reflector surface is typically, but not necessarily, equal to the number of areas of the boundary, thus maximizing the benefits of the invention. One case where there may be fewer sections to the surface than there are areas to the boundary occurs when the transducer is positioned asymmetrically so that the transducer's diaphragm lies closer to one or more areas of the boundary than to the other area or areas. Then adequate results may be obtained by using one reflector surface section for each boundary area which is relatively far from the diaphragm and no reflector surface section for the boundary area or areas which are closer to the diaphragm.

Certain of the improvements which the invention makes possible are made greater by increasing the number of areas of the boundary to which the acoustic system is designed to be proximate. First, the radiation resistance load on the transducer increases. Second, those reflections from nearby boundaries which are out of phase with the direct sound from the transducer are minimized. Third, more standing wave modes of the acoustic space into which the acoustic system radiates sound are excited. In addition, the importance of the acoustic reflector surface in maintaining flat power response over an extended frequency range increases, since the disparity between the lower frequency power output and the upper frequency power output increases as the number of boundary areas increases.

The reflector surface may extend in front of the transducer or behind the transducer between the transducer and the boundary, or simply extend to an area beside the transducer. The surface may or may not be acoustically sealed to the transducer. When the acoustic system includes more than one acoustic transducer the reflector surface should preferably extend from proximate to the center of each of the transducer diaphragms to the boundary, with the spacing of the surface from the diaphragm appropriate from the frequency range of each transducer. The reflector surface may be made of any conventional construction material, e.g. wood.

In one embodiment of the invention an acoustical transducer with integral horn is employed so that the horn forms the interior portion of the reflector surface. Alternatively, the entire reflector surface is made a continuous integral part of the speaker by extending the horn well beyond its normal limits to reach and blend with the boundary.

The acoustic transducer may be an audio loudspeaker device, an ultrasonic device, a sonar device, or any other generator of compression waves, and may have any frequency range. The acoustic transducers such as loudspeakers may be of any variety such as moving coil, ribbon, or other electro-magnetic design, electrostatic, piezoelectric, ionic and the like.

There is shown in FIG. 1, an acoustic system 10 according to this invention including an acoustic transducer or speaker 12 with a diaphragm 13 and a reflector surface 14 including two sections 16 and 18. System 10 is disposed proximate to a boundary 20 which includes two areas 22 and 24 constituted by the walls of a conventional room. Section 16 extends from its inner end 26 close to the center 28 of diaphragm 13 to its outer end 30 at area 22 of boundary 20 in such a way that it forms a gradual transitionary surface between its inner end and the boundary. Similarly section 18 extends from its inner end 32 close to the center 28 of diaphragm 13 to its outer end 34 at area 24 of boundary 20. The junctions of sections 16 and 18 with areas 22 and 24, respectively, of boundary 20 are not abrupt and introduce no substantial acoustic discontinuity. The space 36 between section 16 and area 22 and the space 38 between section 18 and area 24 may be filled with fiber glass batting or other materials if desired.

Figure 2:
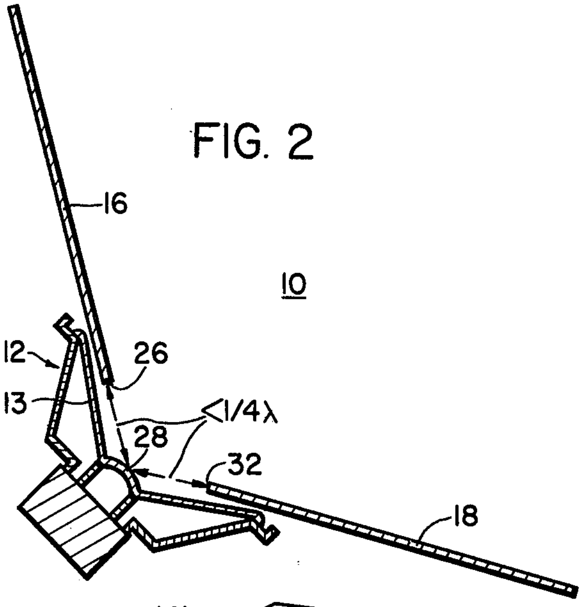
FIG. 2 is an enlarged detailed view of a portion of the acoustic system shown in FIG. 1.

For improved performance the acoustic-path-distance between the center 28 of diaphragm 13 and the inner ends 26 and 32 of sections 16 and 18 is made less than one quarter of the shortest wavelength λ within the bandwidth of speaker 12, as shown in FIG. 2, where like parts have been given like numbers with respect to FIG. 1.

The various arrangements of one or more section of the reflecting surface and one or more acoustic transducers according to this invention are shown in FIGS. 3 A–J wherein like parts have been given like numbers accompanied by a lower case letter corresponding to the upper case letter associated with the drawing.

Figure 3A:
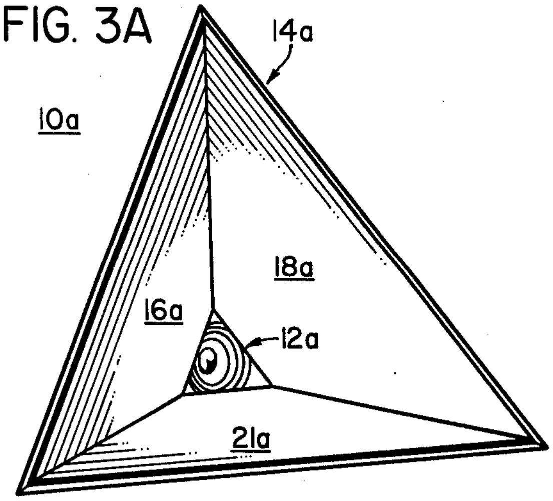

In FIG. 3A acoustic system **10*a* includes reflector surface 14*a* which has three sections 16*a*, 18*a* and 21*a* at the junction of which is located a single acoustic transducer or speaker 12a**.

Figure 3B:
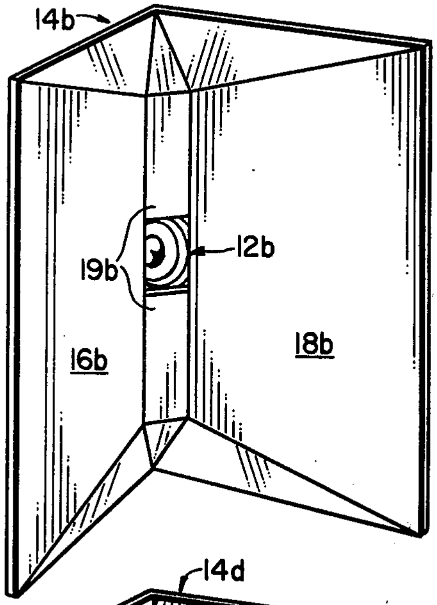
Figure 3C:
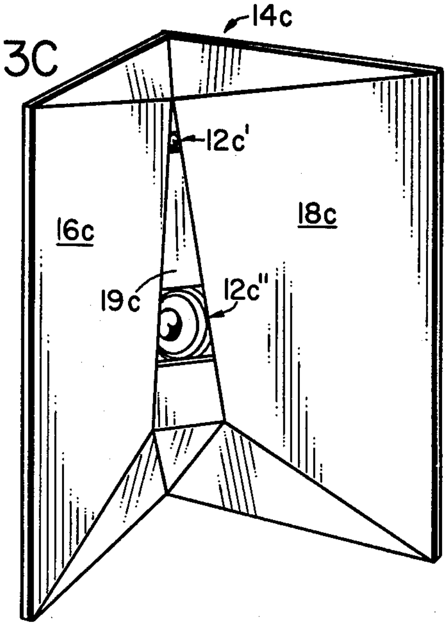
Figure 3D:
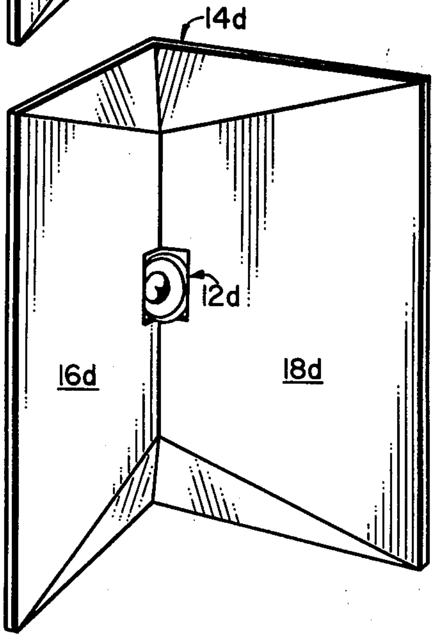

In FIG. 3B, acoustic system **10*b* includes reflector surface 14*b* having two sections 16*b* and 18*b* and a third section 19*b* in which is located an acoustic transducer or speaker 12*b*. In FIG. 3C, system 10*c* includes two acoustic transducers 12*c*′ and 12*c*″ and reflector surface 14*c* which includes sections 16*c* and 18*c* and a third section 19*c*. Speaker 12*c*′ covers a higher frequency range than 12*c*″, the distance between the edges of sections 16*c* and 18*c* and thus the width of section 19*c* at the top of the figure is less than that at the bottom. In FIG. 3D acoustic system 10*d* includes reflector surface 14*d* having two sections 16*d* and 18*d* and an acoustic transducer, speaker 12*d* which extends partly along section 16*d* and partly along section 18*d***.

Figure 3E:
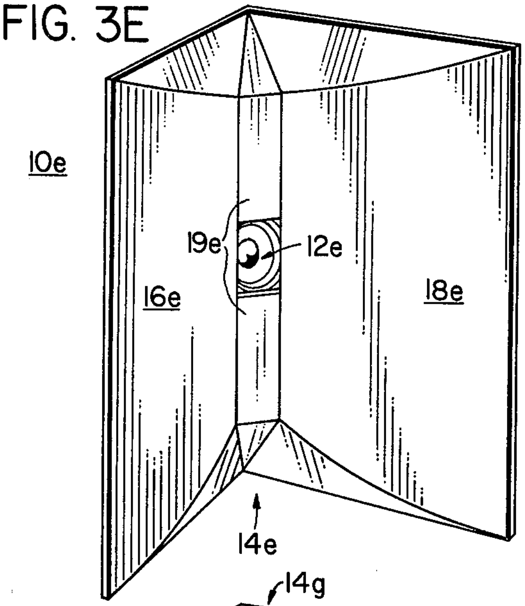
Figure 3F:
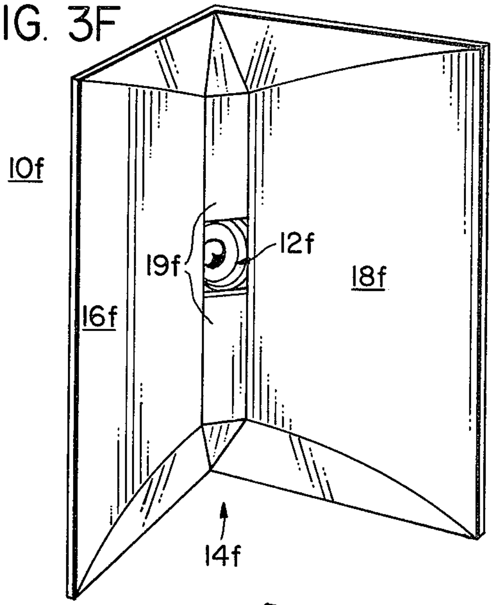
Figure 3G:
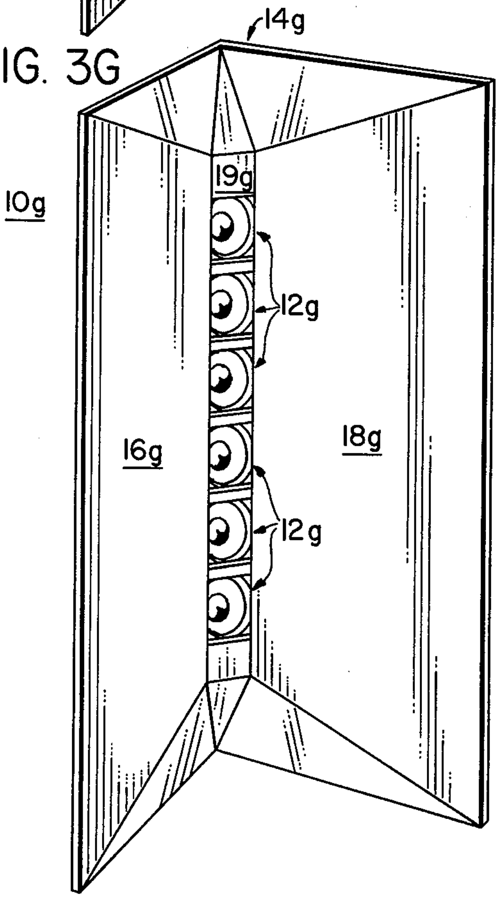
Figure 3H:
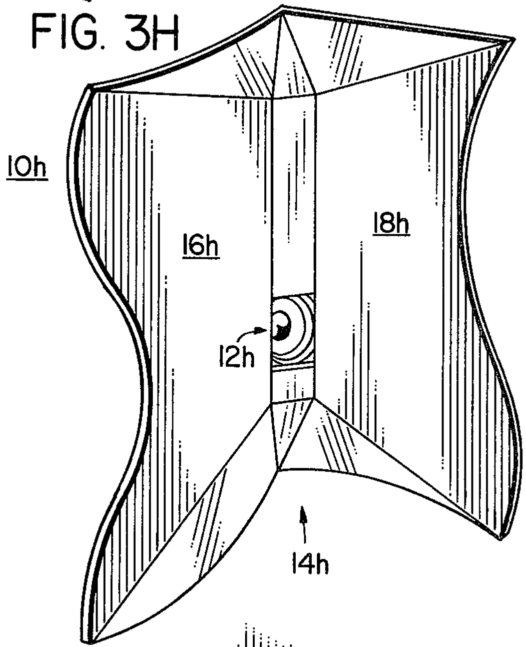
Figure 3I:
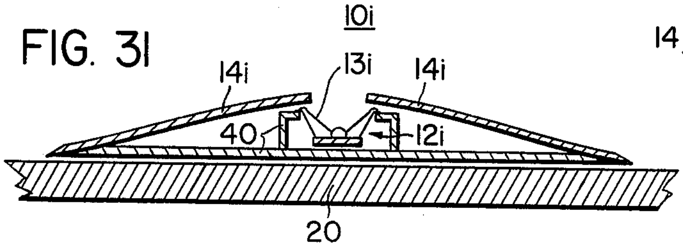
Figure 3J:
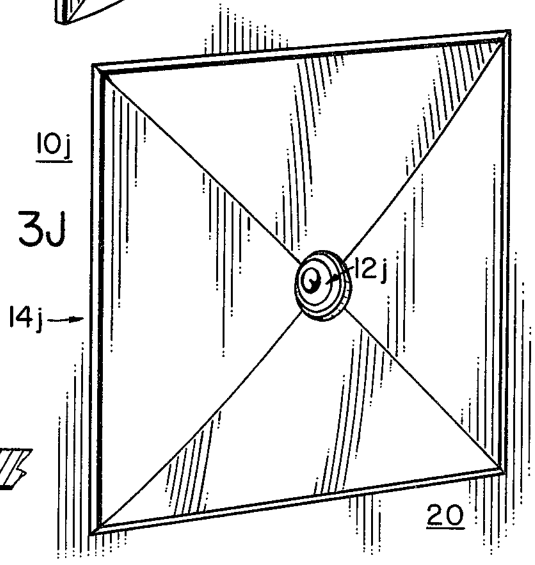

In FIG. 3E, system **10*e* is similar in all respects to system 10*b* shown in FIG. 3B with the exception that sections 16*e* and 18*e* are convexly curved. Similarly in FIG. 3F, system 10*f* is similar in all respects to system 10*e* in FIG. 3E with the exception that sections 16*f* and 18*f* are concavely curved. In FIG. 3G acoustic system 10*g* is constructed in accordance with the design of system 10*b* in FIG. 3B with the addition that in FIG. 3G system 10*g* includes six similar acoustic transducers or speakers 12*g*. In FIG. 3H, acoustic system 10*h* includes sections 16*h* and 18*h* of unequal width and locates acoustic transducer, speaker 12*h*, close to the bottom of reflector surface 14*h*. Surfaces 16*h* and 18*h* have an irregularly shaped outer edge to help minimize diffraction effects. In FIG. 3I, system 10***i* is disposed against boundary 20 which includes but one area such as constituted by one wall of a room. System 10*i* includes speaker 12i supported in speaker mounting 40 and includes a single section reflector surface 14i which extends outward from close to the center of diaphragm 13*i* to boundary 20. Reflector surface 14i is shaped so as to form a gradual transitionary surface between its inner edge close to the diaphragm and the boundary. The unitary continuous nature of reflector surface 14*i* may be better understood with reference to FIG. 3J.

The reflector surface 14 and its one or more sections may be spaced from speaker 12 as shown in FIGS. 1 and 2 or may be sealed to it, as shown in FIG. 4 where like parts have been given like numbers, by means of sealing elements 42 and 44 which interconnect the inner ends 26 and 32 of sections 16 and 18 with support elements 46 and 48, respectively, which mount speaker 12. In FIG. 4 system 10 is included in a self-contained structure by the addition of partitions 50 and 52 which carry support elements 46 and 48 and are attached to sections 16 and 18 proximate to their outer ends 30 and 34, respectively.

Although in the structures pictured in FIGS. 1–4 reflector surface 14 comprising one or more sections is consistently depicted extending close to the center of diaphragm 13 and in front of speaker 12, this is not a necessary limitation of the invention. For as shown in FIG. 5, where like parts have been given like numbers with respect to FIG. 1, reflector surface 14 includes sections 16 and 18 which extend behind speaker 12, between speaker 12 and the areas 22 and 24 of boundary 20. In this case the shortest acoustic-path-distance *d* is not a straight line but follows a curved path extending from the center 28 of the diaphragm 13 of speaker 12 over and around the edge of the diaphragm of speaker 12 to the closest point 60 or section 16 or point 62 on section 18.

Although in the acoustic systems pictured in FIGS. 1–5 speaker 12 is consistently depicted as placed symmetrically relative to the areas of boundary 20 and the number of sections of surface 14 has always equalled the number of areas of boundary 20, this is not a necessary limitation of the invention. For example, in FIG. 6, where like parts have been given like numbers with respect to FIG. 1, the speaker 12 is placed so that its diaphragm 13 is closer to boundary area 24 than to area 22. Reflector surface 14 has but a single section and is positioned and shaped so as to form a gradual transitionary surface between its inner edge 26 close to the center 28 of diaphragm 13 and the area 22 of boundary 20.

Although reflector surface 14, containing one or more sections, in all its variations thus far has been shown as a part separate from the acoustic transducer or speaker 12, this is not a necessary limitation of the invention. For example, in FIG. 7 where like parts have been given like numbers and similar parts like numbers primed with respect to FIG. 1, sections 16' and 18' of reflector surface 14' each includes an outer part 16o and 18o and an inner part 16*n* and 18*n* which also constitute a part of the horn structure of speaker 12'. Alternatively, as shown in FIG. 8 where like parts have been given like numbers and similar parts like numbers double primed with respect to FIGS. 1 and 7, reflector 14'' may be comprised of two sections 16'' and 18'' each of which is integral with and is an extension of the horn structure of speaker 12''.

Although in the structures pictured in FIGS. 1–6 reflector surface 14 comprising one or more sections is consistently depicted with the inner edge lying in front of or behind speaker 12, this is not a necessary limitation of the invention. For as shown in FIG. 9, where like parts have been given like numbers with respect to FIG. 1, reflector surface 14 includes sections 16 and 18 whose inner edges 26 and 32 lie alongside speaker 12.

As shown in each of the structures pictured in FIGS. 1–9 the acoustic transducer or speaker 12 is arranged so that it directs the radiated acoustic waves away from the boundary. However, the acoustic system of this invention may be combined in a unitary structure with other acoustic transducers not included in this system and which may be arranged to radiate sound in any direction. For example, in FIG. 10 acoustic system 70 according to this invention is a part of a unitary structure 72 which also includes a low frequency range speaker enclosure 74 on top of which is mounted acoustic system 70. Structure 72 is disposed in a corner of a room whose walls 76 and 78 constitute the areas of boundary 80 to which sections 82 and 84 of reflector surface 86 extend at their outer ends 88 and 90, respectively. The third section 92 of reflector surface 86 is narrower at the top than at the bottom in order to properly space the inner edges 94 and 96 of sections 82 and 84, respectively, with respect to the smaller high frequency speaker 98 and the larger mid-frequency speaker 100. Speakers 98 and 100 are arranged to radiate the acoustic energy away from boundary 80 into the acoustic space or room; however, a low range speaker 102, shown in phantom, mounted within enclosure 74 is aimed to radiate acoustic energy at an angle to, but at, wall 76 which forms an area of boundary 80.

Panel 104 is the top of low frequency range speaker enclosure 74 and forms a reflective surface near speakers 98 and 100. However, panel 104 is partially covered with a sound absorbtive material 106 to minimize reflections from the panel surface since these reflections will sometimes be out of phase with the sound radiated directly into the room from speakers 98 and 100.

Other embodiments will occur to those skilled in the art and are within the following claims:

What is claimed is:

1. An acoustic system for dispostion proximate to an acoustical boundary comprising at least one acoustic transducer, with a diaphragm, for directing acoustic energy away from the boundary and an acoustic reflector surface extending from proximate to the center of said diaphragm to said boundary without substantial acoustic discontinuity along its extent and at the junction of said boundary and surface.

2. The system of claim 1 in which said boundary includes at least two areas and said surface includes at least two sections which extend from proximate to the center of said diaphragm to the corresponding area of the boundary without substantial acoustic discontinuity along their extent and at the junctions of said boundary and sections.

3. The system of claim 1 in which said surface is acoustically sealed to said transducer.

4. The system of claim 1 in which said surface is smooth.

5. The system of claim 1 in which the portion of said surface proximate to said transducer extends in front of said transducer.

6. The system of claim 1 in which said boundary includes at least two areas and said surface includes at least one section extending from proximate to the center of said diaphragm to the corresponding area of the boundary without substantial acoustic discontinuity along its extent and at the junction of said boundary and surface.

7. The system of claim 1 in which at least a portion of the frequency range of said acoustic system is above 20kHz.

8. The system of claim 1 in which there is at least two acoustic transducers.

9. An acoustic system for disposition proximate to an acoustic boundary having two areas comprising at least one acoustic transducer, with a diaphragm, for directing acoustic energy away from said boundary and an acoustic reflector surface including two sections, each section extending from proximate to the center of said diaphragm to the corresponding one of the area of the boundary without substantial acoustic discontinuity along its extent and at the junction of said boundary and surface.

10. An acoustic system for disposition proximate to an acoustic boundary having three areas comprsing at least one acoustic transducer, with a diaphragm, for directing acoustic energy away from said boundary and an acoustic reflector surface including three sections, each section extending from proximate to the center of said diaphragm to the corresponding area of the boundary without substantial acoustical discontinuity along its extent and at the junction of said boundary and surface.

11. An acoustic system for disposition proximate to an acoustical boundary comprising at least two acoustic transducers, each having a diaphragm, for directing acoustic energy away from said boundary and an acoustic reflector surface extending from proximate to the center of each said diaphragm to the boundary without substantial acoustic discontinuity along its extent and at the junction of said boundary and surface.

12. The system of claim 11 in which said boundary includes at least two areas and said surface includes at least two sections, each section extending to the corresponding area of the boundary without substantial acoustic discontinuity along its extent and at the junction of said boundary and surface.

* * * * *